United States Patent [19]

Dang et al.

[11] Patent Number: 5,041,522
[45] Date of Patent: Aug. 20, 1991

[54] DIHYDROXY-PENDANT RIGID-ROD BENZOBISAZOLE POLYMER

[75] Inventors: Thuy D. Dang, Dayton, Ohio; Hoe H. Chuah, Houston, Tex.; Loon S. Tan; Fred E. Arnold, both of Centerville, Ohio

[73] Assignee: The United States of America as represented by the Secretary of the Air Force, Washington, D.C.

[21] Appl. No.: 498,255

[22] Filed: Mar. 23, 1990

[51] Int. Cl.$^5$ ............................................. C08G 75/32
[52] U.S. Cl. ................................. 528/183; 528/186; 528/193
[58] Field of Search ................... 528/183, 193, 186

[56] References Cited

U.S. PATENT DOCUMENTS 4,835,246  5/1989  Tsai et al. ........................... 528/337

Primary Examiner—Harold D. Anderson
Attorney, Agent, or Firm—Charles E. Bricker; Donald J. Singer

[57] ABSTRACT

There are provided novel rod-like heterocyclic aromatic polymers having repeating groups of the formula:

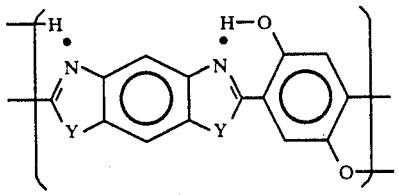

or

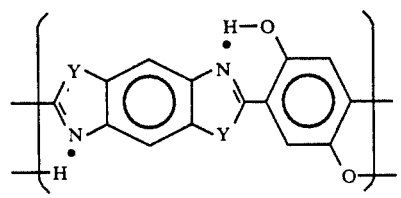

wherein Y is —S—, —O— or —NR—, R is —H, an alkyl group having 1 to 4 carbon atoms or an aromatic group having 1 or 2 aromatic rings, and the bullet symbol (•) indicates hydrogen bonding.

2 Claims, No Drawings

DIHYDROXY-PENDANT RIGID-ROD BENZOBISAZOLE POLYMER

RIGHTS OF THE GOVERNMENT

The invention described herein may be manufactured and used by or for the Government of the United States for all governmental purposes without the payment of any royalty.

BACKGROUND OF THE INVENTION

This invention relates to rod-like heterocyclic aromatic polymers.

Considerable research has been directed toward the synthesis of extended chain or rod-like polymers. The unique ordering properties of these polymers has led to the preparation of extremely high modulus/high strength fibers.

Considerable other research has been devoted to electrically conducting polymers. It has been estimated that replacement of copper wiring in large aircraft with electrically conductive polymer "wires" could result in a weight saving of several hundred pounds. Such a savings in weight would be reflected in a savings in fuel.

A major portion of this research has been directed to polyacetylene. This polymer can be doped by a large variety of substances to room-temperature conductivities of about $10^3$ ohm-cm$^{-1}$. Aromatic polymers such as polyphenylene, polyphenylenevinylene (PPV), and polyphenylene sulfide (PPS) have also been shown to undergo increases in electrical conductivity when exposed to various electron-donor or -acceptor compounds.

It is an object of the present invention to provide novel rod-like heterocyclic aromatic polymers.

It is another object of the present invention to provide novel rod-like heterocyclic aromatic polymers which are at least semi-conducting.

Other objects, aspects and advantages of the present invention will become apparent to those skilled in the art from a reading of the following detailed description of the invention.

SUMMARY OF THE INVENTION

In accordance with the present invention, there are provided novel rod-like heterocyclic aromatic polymers having repeating groups of the formula:

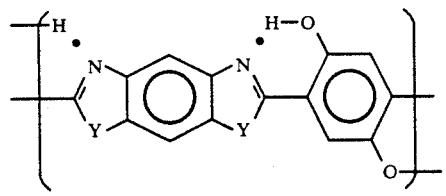
(I)

or

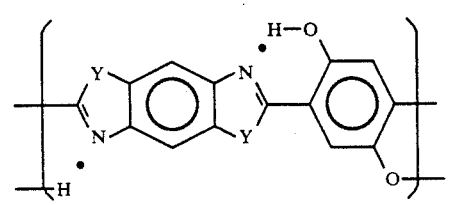
(II)

wherein Y is —S—, —O— or —NR—, wherein R is selected from the group consisting of —H, alkyl having 1 to 4 carbon atoms and aromatic having 1 or 2 aromatic rings. The bullet symbol (•) indicates hydrogen bonding.

DESCRIPTION OF THE INVENTION

Polymers I and II are prepared by reacting an amino monomer of the formula:

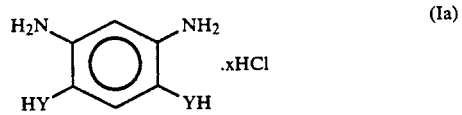
(Ia)

or

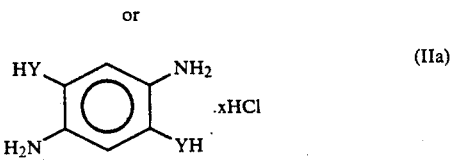
(IIa)

respectively, wherein Y is as defined above, wherein x is 2 or 4, depending on the number of amino groups in the molecule, with 2,5-dihydroxyterephthalic acid, in polyphosphoric acid (PPA).

The 2,5-dihydroxyterephthalic acid may be prepared from diethyl-1,4-cyclohexanedione-2,5-dicarboxylate according to the following reaction sequence:

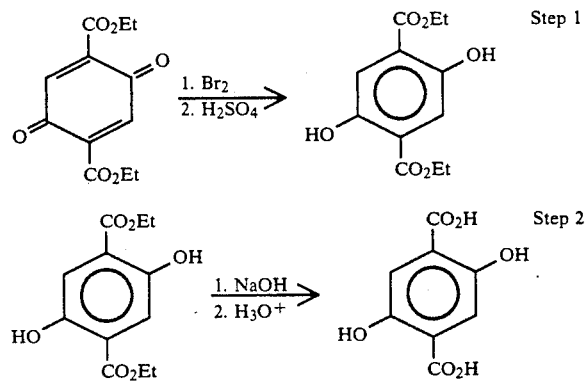

In carrying out the polymerization, the amino monomer Ia or IIa is initially dehydrochlorinated. This is accomplished by mixing the monomer Ia or IIa and the 2,5-dihydroxyterephthalic acid with polyphosphoric acid and heating the mixture under an inert gas atmosphere at a temperature ranging from about 60° to 80° C. for a period of about 6 to 24 hours. In general, stoichiometric quantities of the monomers are used, although a slight excess of one of the monomers may be used.

Following dehydrochlorination, the reaction mixture is heated at a temperature in the approximate range of 100° to 200° C. for a period of about 18 to 36 hours. In a preferred Procedure, the reaction temperature is increased gradually during the reaction period, e.g., 130° C. for 3 hours, 150° C. for 3 hours, 170° C. for hours, 185° C. for 3 hours, and 195°-200° C. for 16 hours, or 160° C. for 16 hours and 190° C. for 16 hours, or the like.

At the end of the reaction period, a small aliquot of the polymer is precipitated from solution into water, washed with water until acid-free and air dried. If the intrinsic viscosity of the polymer in methanesulfonic acid is not within the desired range of about 8 to 31 dl/g, polymerization is continued until an aliquot sample has the desired viscosity.

Intrinsic viscosity is determined by extrapolation of $\eta$ rel-1/c and ln $\eta$ rel/c to zero concentration in methanesulfonic acid at 30° C.

At the end of the reaction period, the polymer is precipitated from solution by pouring the reaction mixture into a coagulation bath, such as water or methanol. If a bulk polymer is desired, the reaction mixture is poured directly into the coagulation bath, with or without stirring. The polymer may also be formed into fibers by extruding the polymer/PPA solution through a suitable spinnerette into the coagulation bath. The resulting fiber may be drawn and heat-treated following known procedures.

The following examples illustrate the invention:

EXAMPLE I

Diethyl-1,4-cyclohexanedione-2,5-dicarboxylate is reacted with bromine in cold sulfuric acid (0°−10° C.) to provide the aromatized product, diethyl-2,5-dihydroxyterephthalate. Hydrolysis of the diethyl-2,5-dihydroxyterephthalate by refluxing in aqueous sodium hydroxide followed by acidification with HCl provides 2,5-dihydroxyterephthalic acid. The diacid may be converted to the diacid halide by reaction with thionyl halide in diethyl ether.

EXAMPLE II

Poly[benzo[1,2-d:4,5-d']bisthiazole-2,6-diyl (2,5-dihydroxy-p-phenylene)]

Into the bottom of a resin flask equipped with a high torque mechanical stirrer, nitrogen inlet/outlet, pressure regulator and a side opening for additions, was placed 4.904 g (20 mmol) of 2,5-diamino-1,4-benzenedithiol dihydrochloride, 3.962 g (20 mmol) of 2,5-dihydroxyterephthalic acid and 18.74 g of PPA (77% $P_2O_5$). The monomers were incorporated into the PPA by stirring. The resulting mixture was then dehydrochlorinated under reduced pressure (176 mm) while slowly heating the mixture to 80° C. The reaction temperature was maintained at 80° C. for 24 hours, then cooled to 60° C. 13.64 g of $P_2O_5$ was added to the mixture, thus raising the final polymer concentration to 15%. The mixture was heated under a positive nitrogen flow at 60° C. for 4 hr, 100° C. for 2 hr and 140° C. for 24 hr. As the temperature was increased, opalescence began to appear at about 120° C. The polymer was precipitated into water, collected by suction filtration, washed with ammonium hydroxide, washed with water and dried under reduced pressure (0.02 mm) at 110° C. An intrinsic viscosity of 28 dl/g was obtained in methanesulfonic acid at 30° C.

EXAMPLE III

Poly[benzo[1,2-d:4,5-d']bisoxazole-2,6-diyl (2,5-dihydroxy-p-phenylene)]

Into the bottom of a resin flask equipped with a high torque mechanical stirrer, nitrogen inlet/outlet, pressure regulator and a side opening for additions, was placed 3.873 g (18.2 mmol) of 4,6-diaminoresorcinol dihydrochloride, 4.27 g (18.2 mmol) of 2,5-dihydroxyterephthalyl chloride and 29.3 g of PPA (77% $P_2O_5$). The monomers were incorporated into the PPA by stirring. The resulting mixture was then dehydrochlorinated under reduced pressure (176 mm) by heating at 60° C. for 24 hr and 80° C. for 5 hr. The reaction mixture was then cooled to 50° C. 13.54 g of $P_2O_5$ was added to the mixture, thus raising the final polymer concentration to 14%. The mixture was heated under a positive nitrogen flow at 130° C. for 16 hr, 170° C. for 20 hr and 190° C. for 4 hr. The polymer was precipitated into water, collected by suction filtration, washed with ammonium hydroxide, washed with water and dried under reduced pressure (0.02 mm) at 110° C. An intrinsic viscosity of 21.8 dl/g was obtained in methanesulfonic acid at 30° C.

EXAMPLE IV

Poly[benzo[1,2-d:4,5-d']bisimidazole-2,6-diyl (2,5-dihydroxy-p-phenylene)]

Into the bottom of a resin flask equipped with a high torque mechanical stirrer, nitrogen inlet/outlet, pressure regulator and a side opening for additions, was placed 5.37 g (18.92 mmol) of 1,2,4,5-tetraaminobenzene tetrahydrochloride, 4.45 g (18.92 mmol) of 2,5-dihydroxyterephthalyl chloride and 1 30.3 g of PPA (77% $P_2O_5$). The monomers were incorporated into the PPA by stirring. The resulting mixture was then dehydrochlorinated under reduced pressure (176 mm) by heating at 60° C. for 24 hr and 80° C. for 16 hr. The reaction mixture was then cooled to 50° C. 14.02 g of $P_2O_5$ was added to the mixture, thus raising the final polymer concentration to 10%. The mixture was heated under a positive nitrogen flow at 130° C for 16 hr, 170° C. for 20 hr and 190° C. for 4 hr. The polymer was precipitated into water, collected by suction filtration, washed with ammonium hydroxide, washed with water and dried under reduced pressure (0.05 mm) at 100° C. An intrinsic viscosity of 16.2 dl/g was obtained in methanesulfonic acid at 30° C.

EXAMPLE V

The anisotropic reaction mixture of Example II was spun into monofilament fibers using a dry-jet wet spinning method with a 10 mil. diameter spinnerette and coagulated in distilled water. The air gap where the fiber was stretched was maintained at 8 inches. After neutralization with 3% $NH_4OH$ and washing with water, the fibers were tension dried at 150° C., then heat treated in a tube oven under an inert nitrogen atmosphere at 435° C. with 30-sec residence time. The resulting fiber had a modulus of 25 Msi, tensile of 304 Ksi and an elongation at break of 1.3%.

Conductivity measurements on the fibers revealed that the as-spun fiber had a conductivity of $10^-$ohm$^{-1}$cm$^{-1}$. The heat treated fiber had a cOnductivity of $10^{-8}$ ohm$^{-1}$cm$^{-1}$. In contrast, PBT (polybenzothiazole) fibers (without the hydroxy groups on the phenylene moiety) had a conductivity of $10^{-12}$ ohm$^{-1}$cm$^{-1}$.

The high molecular weight ordered polymers of this invention exhibit excellent strength, modulus and semiconducting properties. The thermal properties of these materials indicate that they will be stable to ion implantation and provide conductivities up to about $10^4$ S/cm. These polymers are suitable substitutes for other inorganic or organic products. In particular, the semiconducting fibers of this invention are suitable for use in reinforcing structures which must bleed off charges of static electricity. The polymers of this invention, with ion implantation, are suitable for replacement of copper wiring.

Various modifications may be made to the invention as described without departing from the spirit of the invention or the scope of the appended claims.
We claim:
1. A rod-like heterocyclic aromatic polymer having repeating groups of the formula:
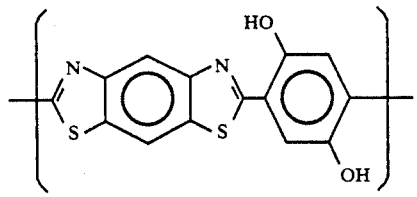
2. A rod-like heterocyclic aromatic polymer having repeating groups of the formula:
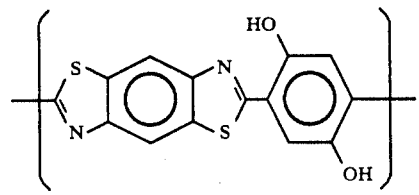
* * * * *

UNITED STATES PATENT AND TRADEMARK OFFICE
CERTIFICATE OF CORRECTION

PATENT NO. : 5,041,522

DATED : August 20, 1991

INVENTOR(S) : Thuy D. Dang et al

It is certified that error appears in the above-identified patent and that said Letters Patent is hereby corrected as shown below:

Col 2, line 60, "Procedure" should be -- procedure --.
Col 4, line 21, "1" should be deleted.
Col 4, line 51, "cOnduc-" should be -- conduc- --.

Signed and Sealed this

Ninth Day of February, 1993

Attest:

STEPHEN G. KUNIN

*Attesting Officer*  Acting Commissioner of Patents and Trademarks